United States Patent
Kamata (10) Patent No.: US 9,753,091 B2
(45) Date of Patent: Sep. 5, 2017

(54) VOLTAGE DETECTING DEVICE

(71) Applicant: KEIHIN CORPORATION, Tokyo (JP)

(72) Inventor: Seiji Kamata, Shioya-gun (JP)

(73) Assignee: KEIHIN CORPORATION, Tokyo (JP)

( * ) Notice: Subject to any disclaimer, the term of this patent is extended or adjusted under 35 U.S.C. 154(b) by 171 days.

(21) Appl. No.: 14/702,074

(22) Filed: May 1, 2015

(65) Prior Publication Data

US 2015/0331054 A1    Nov. 19, 2015

(30) Foreign Application Priority Data

May 15, 2014 (JP) ................................. 2014-101330

(51) Int. Cl.
  *G01R 31/36* (2006.01)
  *B60L 11/18* (2006.01)

(52) U.S. Cl.
  CPC ...... *G01R 31/3658* (2013.01); *B60L 11/1851* (2013.01); *G01R 31/362* (2013.01)

(58) Field of Classification Search
  CPC .................................................. G01R 31/3658
  See application file for complete search history.

(56) References Cited

U.S. PATENT DOCUMENTS 6,313,637 B1 * 11/2001 Iino ..................... B60L 11/1851
                                                            324/434
2012/0141848 A1    6/2012 Nagaoka et al.

FOREIGN PATENT DOCUMENTS

| JP | 9-230009 A | 9/1997 |
| JP | 2010-537362 A | 12/2010 |
| JP | 2011-217606 A | 10/2011 |

* cited by examiner

*Primary Examiner* — Drew A Dunn
*Assistant Examiner* — Sailesh Thapa
(74) *Attorney, Agent, or Firm* — Westerman, Hattori, Daniels & Adrian, LLP (57) ABSTRACT

Disclosed herein is a voltage detecting device including: an analog converting circuit configured to level-convert voltages of a plurality of battery cells constituting a battery into low voltages; a digital converting circuit configured to convert the low voltages output by the analog converting circuit into digital values; and a control circuit configured to be driven by a power supply provided separately to control the digital converting circuit; the analog converting circuit being driven by a first power generated from the plurality of battery cells, and the digital converting circuit being driven by a second power generated on a basis of a pulse signal generated by the control circuit.

5 Claims, 4 Drawing Sheets

VOLTAGE DETECTING DEVICE

CROSS REFERENCE TO RELATED APPLICATION

The present claims priority under 35 U.S.C. §119 to Japanese Patent Application No 2014-101330 filed in the Japan Patent Office on May 15, 2014, the entire content of which is hereby incorporated by reference.

TECHNICAL FIELD

The present invention relates to a voltage detecting device.

BACKGROUND OF THE INVENTION

A power supply constituted of a plurality of battery cells is used in an electric vehicle, a hybrid vehicle, and the like.

Japanese Patent Laid-Open No. 2011-217606 describes, as a related technology, a technology related to the detection of voltages of battery cells.

SUMMARY OF THE INVENTION

In general, various circuits using different power supply voltages are used in a voltage detecting device that detects the voltages of battery cells. In such a case, generating the various power supply voltages from a single power supply to supply power to the respective circuits may degrade efficiency at the time of the generation of the plurality of power supply voltages necessary for the voltage detecting device. As a result, there is a possibility of the power of current supply from the single power supply becoming insufficient, the power supply voltages necessary for the voltage detecting device being unable to be generated, and consequently the voltage detecting device being unable to detect the voltages of the battery cells.

There has thus been a desire for a technology suitable for detecting the voltages of battery cells in a case where various circuits using different power supply voltages are used in a voltage detecting device.

It is desirable of the present disclosure to provide a voltage detecting device that can solve the above problems.

According to embodiments of the present disclosure, there is provided a voltage detecting device including: an analog converting circuit configured to level-convert voltages of a plurality of battery cells constituting a battery into low voltages; a digital converting circuit configured to convert the low voltages output by the analog converting circuit into digital values; and a control circuit configured to be driven by a power supply provided separately to control the digital converting circuit; the analog converting circuit being driven by a first power generated from the plurality of battery cells, and the digital converting circuit being driven by a second power generated on a basis of a pulse signal generated by the control circuit.

In addition, according to the present disclosure, the voltage detecting device further includes a smoothing circuit configured to generate the second power by smoothing the pulse signal generated by the control circuit.

In addition, according to the present disclosure, the pulse signal in the voltage detecting device is a modulated signal including control information for the digital converting circuit.

In addition, according to the present disclosure, the modulated signal in the voltage detecting device is a pulse width modulation (PWM) signal indicating the control information as a duty ratio.

In addition, according to the present disclosure, the pulse signal in the voltage detecting device is supplied from the control circuit to the smoothing circuit via a pulse transformer.

According to the present disclosure, it is possible to provide a technology suitable for detecting the voltages of battery cells in a case where various circuits using different power supply voltages are used in a voltage detecting device.

BRIEF DESCRIPTION OF THE DRAWINGS

The advantages of this invention will become apparent in the following description taken in conjunction with the drawings, wherein.

DETAILED DESCRIPTION OF THE INVENTION

First Embodiment

Figure 1:
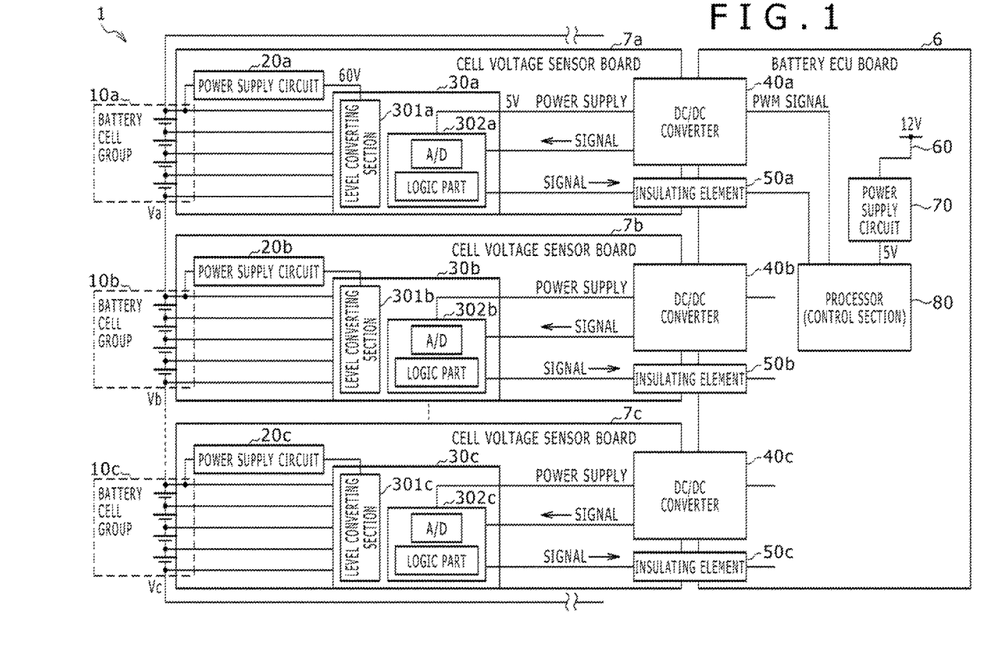
FIG. 1 is a diagram showing an example of a voltage detecting device according to a first embodiment of the present disclosure.

FIG. 1 is a diagram showing an example of a voltage detecting device 1 according to a first embodiment of the present disclosure.

As shown in FIG. 1, the voltage detecting device 1 according to the first embodiment includes a battery electronic control unit (ECU) board 6, cell voltage sensor boards 7a, 7b, 7c, . . . , and battery cell groups (plurality of battery cells) 10a, 10b, 10c, . . . .

The cell voltage sensor board 7a included in the voltage detecting device 1 includes a power supply circuit 20a, an integrated circuit 30a, a direct current (DC)/DC converter 40a, and an insulating element 50a.

The power supply circuit 20a included in the cell voltage sensor board 7a generates a voltage to be supplied to the power supply of a level converting section (analog converting circuit) included in the integrated circuit 30a with a lowest potential of the battery cell group 10a as a reference potential Va. For example, the power supply circuit 20a generates the power supply voltage for the analog converting circuit with Va as a reference potential by raising the voltage of the battery cell group 10a.

Each of the battery cell groups 10a, 10b, and 10c is formed by a plurality of battery cells.

The integrated circuit 30a includes a level converting section (analog converting circuit) 301a and an analog to digital (A/D) converting circuit (digital converting circuit) 302a.

The level converting section 301a converts the cell voltage of each battery cell in the battery cell group 10a such that a maximum voltage output by the plurality of battery cells becomes a voltage corresponding to the full scale of the A/D converting circuit 302a. The level converting section 301a is a circuit operating (driven) by a power (first power) of a high voltage (for example 60 volts) because the circuit is supplied with the voltage of each battery cell in the battery cell group 10a.

The A/D converting circuit 302a is supplied with the cell voltage after the conversion by the level converting section 301a, and generates a corresponding digital signal (digital value). The A/D converting circuit 302a is a circuit operating (driven) by a power (second power) of a low voltage (for example 5 volts).

The DC/DC converter 40a generates a voltage to be supplied to the power supply of the A/D converting circuit (digital converting circuit) 302a included in the integrated circuit 30a. For example, the DC/DC converter 40a generates a voltage of 5 volts with respect to the reference potential Va on the basis of a pulse width modulation (PWM) signal (pulse signal) generated by a processor (control circuit) 80.

The insulating element 50a transmits information indicating the voltages of the battery cells which information results from the conversion by the integrated circuit 30a to the processor 80 without transferring current between the cell voltage sensor board 7a and the battery ECU board 6.

The cell voltage sensor board 7b has functional sections similar to those of the cell voltage sensor board 7a except that the reference potential is Vb. Specifically, the cell voltage sensor board 7b includes a power supply circuit 20b, an integrated circuit 30b, a DC/DC converter 40b, and an insulating element 50b.

Similarly, the cell voltage sensor board 7c has functional sections similar to those of the cell voltage sensor board 7a except that the reference potential is Vc. Specifically, the cell voltage sensor board 7c includes a power supply circuit 20c, an integrated circuit 30c, a DC/DC converter 40c, and an insulating element 50c.

The battery ECU board 6 includes the DC/DC converters 40a, 40b, 40c, . . . , the insulating elements 50a, 50b, 50c, . . . , a power supply 60 (power supply provided separately), a power supply circuit 70, and the processor 80.

The power supply 60 outputs a voltage to the power supply circuit 70. For example, the power supply 60 outputs a voltage of 12 volts to the power supply circuit 70.

The power supply circuit 70 generates a power supply voltage necessary for the operation (driving) of the processor 80 on the basis of the voltage output by the power supply 60. For example, the power supply circuit 70 generates a voltage of 5 volts from the voltage of 12 volts output by the power supply 60.

The processor 80 generates a PWM signal for the DC/DC converter 40a to generate the power supply voltage for the A/D converting circuit 302a. In addition, the processor 80 obtains the information on the voltage of each battery cell which results from the conversion by the A/D converting circuit 302a via the insulating element 50a. Incidentally, the processor 80 may generate a command signal indicating timing of sampling of the cell voltage of each battery cell by the A/D converting circuit 302a.

In the following, the cell voltage sensor boards 7a, 7b, 7c, . . . will be referred to collectively as a cell voltage sensor board 7. Similarly, the battery cell groups 10a, 10b, 10c, . . . will be referred to collectively as a battery cell group 10. The power supply circuits 20a, 20b, 20c, . . . will be referred to collectively as a power supply circuit 20. The integrated circuits 30a, 30b, 30c, . . . will be referred to collectively as an integrated circuit 30. The DC/DC converters 40a, 40b, 40c, . . . will be referred to collectively as a DC/DC converter 40. The insulating elements 50a, 50b, 50c, . . . will be referred to collectively as an insulating element 50. The level converting sections 301a, 301b, 301c, . . . will be referred to collectively as a level converting section 301. The A/D converting circuits 302a, 302b, 302c, . . . will be referred to collectively as an A/D converting circuit 302.

Figure 2:
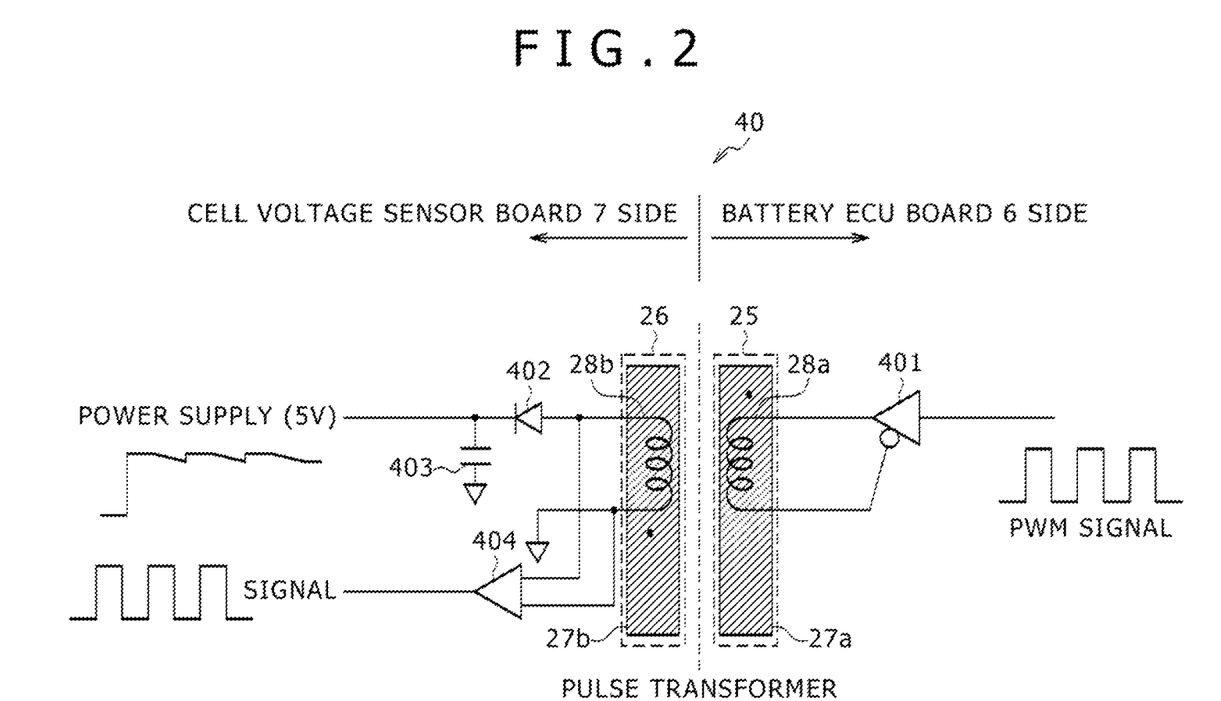
FIG. 2 is a diagram showing an example of a direct current (DC)/DC converter according to the first embodiment of the present disclosure.

FIG. 2 is a diagram showing an example of the DC/DC converter 40 according to the first embodiment of the present disclosure.

As shown in FIG. 2, the DC/DC converter 40 according to the first embodiment includes a first communication element 25, a second communication element 26, a switching element 401, a diode 402, a capacitor 403, and a differential buffer 404.

The DC/DC converter 40 according to the first embodiment which DC/DC converter 40 is shown in FIG. 2 is a DC/DC converter of a configuration generally referred to as a flyback type.

The first communication element 25 includes a core 27a and a coil 28a. The second communication element 26 includes a core 27b and a coil 28b. The coil 28a is a primary coil. The coil 28b is a secondary coil. The coil 28a and the coil 28b are arranged so as to be opposite in polarity from each other, and form a pulse transformer.

When the switching element 401 is in an on state, it is difficult for the coil 28b to send a current because of the presence of the diode 402. At this time, the core 27b is magnetized, and stores a magnetic energy. When the switching element 401 is in an off state, no current flows through the coil 28a. At this time, the magnetic energy stored by the core 27b causes a current to flow from the coil 28b through the diode 402. The capacitor 403 stores a charge on the basis of the current. Thus, the diode 402 performs rectification and the capacitor 403 (smoothing circuit) performs smoothing, whereby a desired voltage can be generated on the side of the cell voltage sensor board 7 on the basis of the PWM signal generated on the side of the battery ECU board 6. In addition, for example, the pulse width, that is, the duty ratio of the PWM signal generated on the side of the battery ECU board 6, is made to have control information desired to be transmitted to the side of the cell voltage sensor board 7. Therefore, the PWM signal (modulated signal) can be not only used to transmit energy but also used to transmit information.

Description will next be made of the processing of the voltage detecting device 1 according to the first embodiment. Incidentally, in the following, the processing of the voltage detecting device 1 will be described by taking as an example a case where the voltage detecting device 1 shown in FIG. 1 has the DC/DC converter 40 shown in FIG. 2. Incidentally, in an electric vehicle, a hybrid vehicle, or the like, the cell voltages of battery cells are monitored to prevent the battery cells from being overcharged, and the voltage detecting device 1 detects the cell voltages in the battery cell group 10. In addition, suppose that each integrated circuit 30 and the corresponding battery cell group 10 are connected to each other such that the lowest potentials of the respective integrated circuits 30 coincide with the lowest potentials of the respective corresponding battery cell groups 10.

The power supply circuit 20 generates a voltage (for example 60 volts) necessary for the operation of the level converting section 301 by raising a voltage (for example 38 volts) output by the battery cell group with the lowest potential of the corresponding battery cell group 10 as a reference. The power supply circuit 20 outputs the generated voltage to the level converting section 301. The level converting section 301 thereby becomes operable.

The power supply circuit 70 generates a voltage (for example 5 volts) necessary for the operation of the processor 80 from a voltage (for example 12 volts) output by the power supply 60. The power supply circuit 70 outputs the generated voltage to the processor 80. The processor 80 thereby becomes operable.

When the processor 80 becomes operable, the processor 80 generates a PWM signal. The processor 80 outputs the generated PWM signal to each DC/DC converter 40.

The DC/DC converter 40 is a circuit of the flyback type shown in FIG. 2, for example. When the switching element 401 included in the DC/DC converter 40 is supplied with the PWM signal from the processor 80, the switching element 401 is set in an on state to send a current through the coil 28a included in the first communication element 25 during the period that the PWM signal is in a High state. At this time, it is difficult for the coil 28b included in the second communication element 26 to send a current because of the presence of the diode 402. Then, the core 27b is magnetized, and stores a magnetic energy.

The switching element 401 is set in an off state during the period that the PWM signal is in a Low state. Then, no current flows through the coil 28a. At this time, the magnetic energy stored by the core 27b causes a current to flow from the coil 28b through the diode 402. The capacitor 403 stores a charge on the basis of the current sent by the diode 402.

A power supply terminal of the A/D converting circuit 302 is connected to the capacitor 403. The power supply of the A/D converting circuit 302 is supplied with a voltage of 5 volts and a current from the diode 402 during the period that the diode 402 sends the current. During the period that the diode 402 does not send the current, the charge stored by the capacitor 403 is discharged, and thereby the power supply of the A/D converting circuit 302 is supplied with a voltage of 5 volts and a current.

After the level converting section 301 and the A/D converting circuit 302 are supplied with the respective power supply voltages, the processor 80 generates a PWM signal including information indicating the timing of sampling of each cell voltage in the battery cell group 10. For example, the processor 80 generates a PWM signal such that the pulse width, that is, the duty ratio of the PWM signal has control information (which PWM signal will hereinafter be referred to as a PWM information signal). The processor 80 outputs the generated PWM information signal to the DC/DC converter 40.

When the switching element 401 included in the DC/DC converter 40 is supplied with the PWM information signal, the switching element 401 switches between an on state and an off state according to the High period and the Low period indicated by the PWM information signal. A voltage corresponding to the on state and the off state of the switching element 401 is generated as voltage across the coil 28b included in the second communication element 26. The differential buffer 404 is connected to both ends of the coil 28b. The differential buffer 404 outputs a signal including information indicating the timing of sampling of each cell voltage in the battery cell group 10, the information being based on the PWM information signal, to the corresponding A/D converting circuit 302.

At this time, the level converting section 301 is converting each cell voltage input from the battery cell group 10 into a voltage of a magnitude according to the full scale of the A/D converting circuit 302. For example, the level converting section 301 converts the voltage of each battery cell in a ratio in which a maximum voltage output by the plurality of battery cells is converted into a voltage corresponding to the full scale of the A/D converting circuit 302.

When the A/D converting circuit 302 is supplied with the signal including the information indicating the sampling timing from the differential buffer 404, the A/D converting circuit 302 obtains each cell voltage after the conversion by the level converting section 301 from the level converting section 301 in the sampling timing. The A/D converting circuit 302 converts each cell voltage (analog signal) obtained from the level converting section 301 into a digital signal. The A/D converting circuit 302 outputs the digital signal after the conversion to the insulating element 50. The insulating element 50 generates a signal on the basis of the digital signal input from the A/D converting circuit 302. When the digital signal is represented by a voltage, and the insulating element 50 is a photocoupler, for example, the photocoupler is supplied with an input current corresponding to the digital signal using a resistance. The photocoupler generates light corresponding to the input current, and emits the light from the cell voltage sensor board 7 to the battery ECU board 6 within the photocoupler. The photocoupler converts the generated light into a corresponding current on the battery ECU board 6.

The insulating element 50 outputs the current corresponding to the light to the processor 80. The processor 80 is supplied with a signal corresponding to the current output by the insulating element 50. For example, the processor 80 converts the current corresponding to the digital signal into a voltage by a resistance, and is supplied with a digital signal indicated by the voltage. This digital signal is generated on the basis of the digital signal output by the A/D converting circuit 302, and includes the information on each cell voltage obtained from the level converting section 301.

The processor 80 performs control so as to prevent the battery cell group 10 from being overcharged, by outputting command signals to various circuits (not shown) managed by the processor 80 on the basis of the input digital signal.

Incidentally, an example has been illustrated above in which the power supply voltage of the level converting section 301 and the power supply voltage of the A/D converting circuit 302 are two different power supply voltages. However, the power supply voltage of the level converting section 301 and the power supply voltage of the A/D converting circuit 302 are not limited to two different power supply voltages. For example, the A/D converting circuit 302 may be a circuit in which an analog circuit and a digital circuit operate on different power supply voltages, and the power supply voltage of the analog circuit may be 5 volts and the power supply voltage of the digital circuit may be 1.8 volts. In such a case, the power supply voltage of the analog circuit and the power supply voltage of the digital circuit may be generated from the voltage of 5 volts applied to the A/D converting circuit 302. Alternatively, the 5 volts applied to the A/D converting circuit 302 may be used as the power supply voltage of the analog circuit, and the power supply voltage of the digital circuit may be supplied from another power supply.

The processing of the voltage detecting device 1 according to the first embodiment of the present disclosure has been described above. According to the above-described voltage detecting device 1, the voltage detecting device 1 includes the integrated circuit 30. The integrated circuit 30 includes the level converting section 301 that operates on the voltage generated on the basis of the voltage output by the battery cell group 10. The integrated circuit 30 has the A/D converting circuit 302 that operates on the voltage generated on the basis of the PWM signal generated by the processor. The integrated circuit 30 detects the cell voltages in the battery cell group 10.

Thus, it is possible to provide a technology suitable for detecting the voltages of battery cells in a case where various circuits using different power supply voltages are used in the voltage detecting device 1.

In addition, the processor 80 generates a PWM information signal including command information for the A/D converting circuit 302.

Thus, a total number of insulating elements 50 for performing communication in the voltage detecting device 1 can be reduced.

In addition, the A/D converting circuit 302 outputs, to the processor 80, a digital signal including information on each cell voltage obtained from the level converting section 301.

Thus, the processor 80 in the voltage detecting device 1 can prevent the battery cell group 10 from being overcharged, by outputting command signals to the various circuits managed by the processor 80 on the basis of the digital signal including the information on each cell voltage.

Second Embodiment

Figure 3:
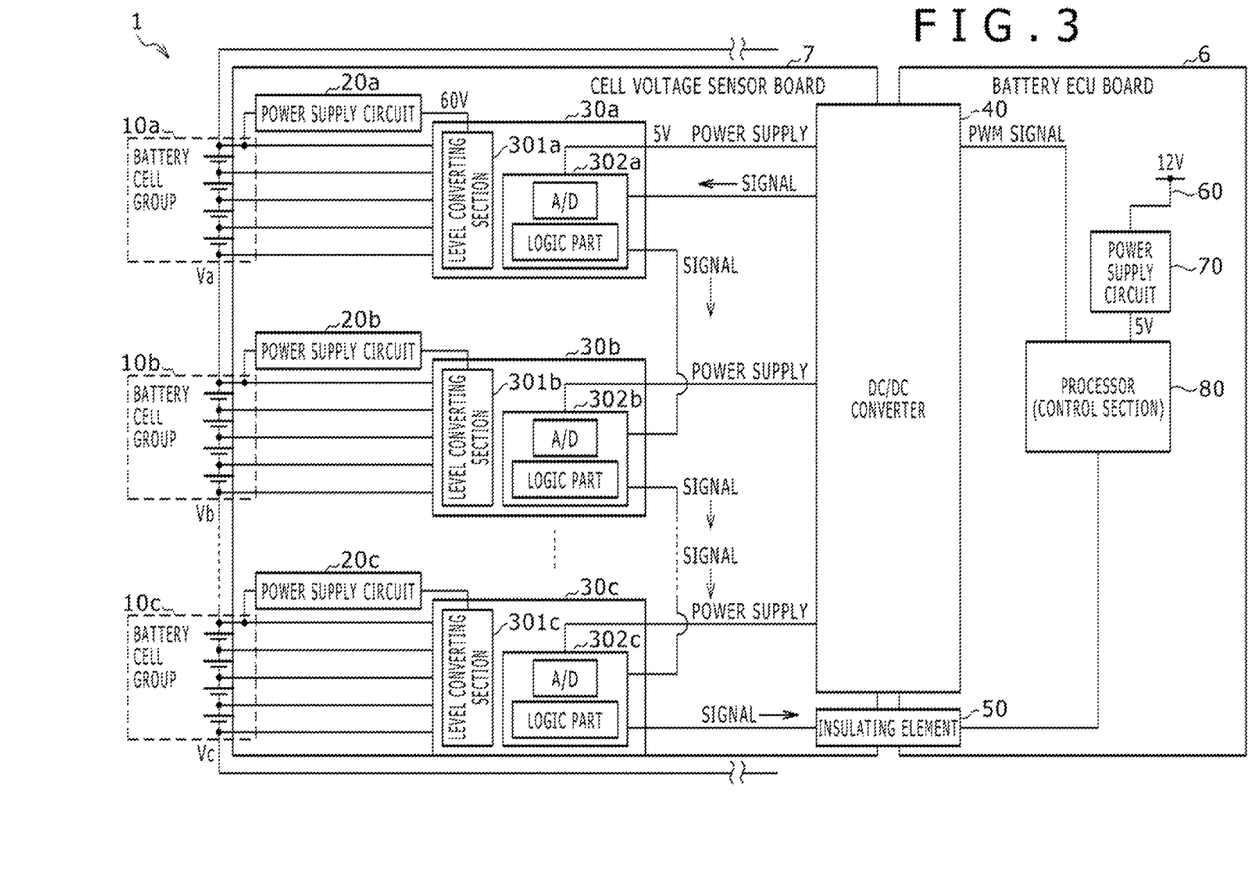
FIG. 3 is a diagram showing an example of a voltage detecting device according to a second embodiment of the present disclosure.

FIG. 3 is a diagram showing an example of a voltage detecting device 1 according to a second embodiment of the present disclosure.

As shown in FIG. 3, the voltage detecting device 1 according to the second embodiment has integrated circuits 30 and a DC/DC converter 40 that are different from those of the voltage detecting device 1 according to the first embodiment.

In addition, the voltage detecting device 1 according to the second embodiment includes one cell voltage sensor board 7, whereas the voltage detecting device 1 according to the first embodiment includes a plurality of cell voltage sensor boards 7.

Whereas each of the integrated circuits 30 according to the first embodiment outputs a digital signal to the processor 80 via the insulating element 50, the integrated circuits 30 according to the second embodiment transmit and receive digital signals between the integrated circuits 30, and integrate the plurality of digital signals into one digital signal. The digital signal is thereafter output to a processor 80 via an insulating element 50.

The DC/DC converter 40 includes a plurality of coils 28b, whereas the second communication element 26 according to the first embodiment includes one coil 28b. The plurality of coils 28b correspond to the respective integrated circuits 30.

Figure 4:
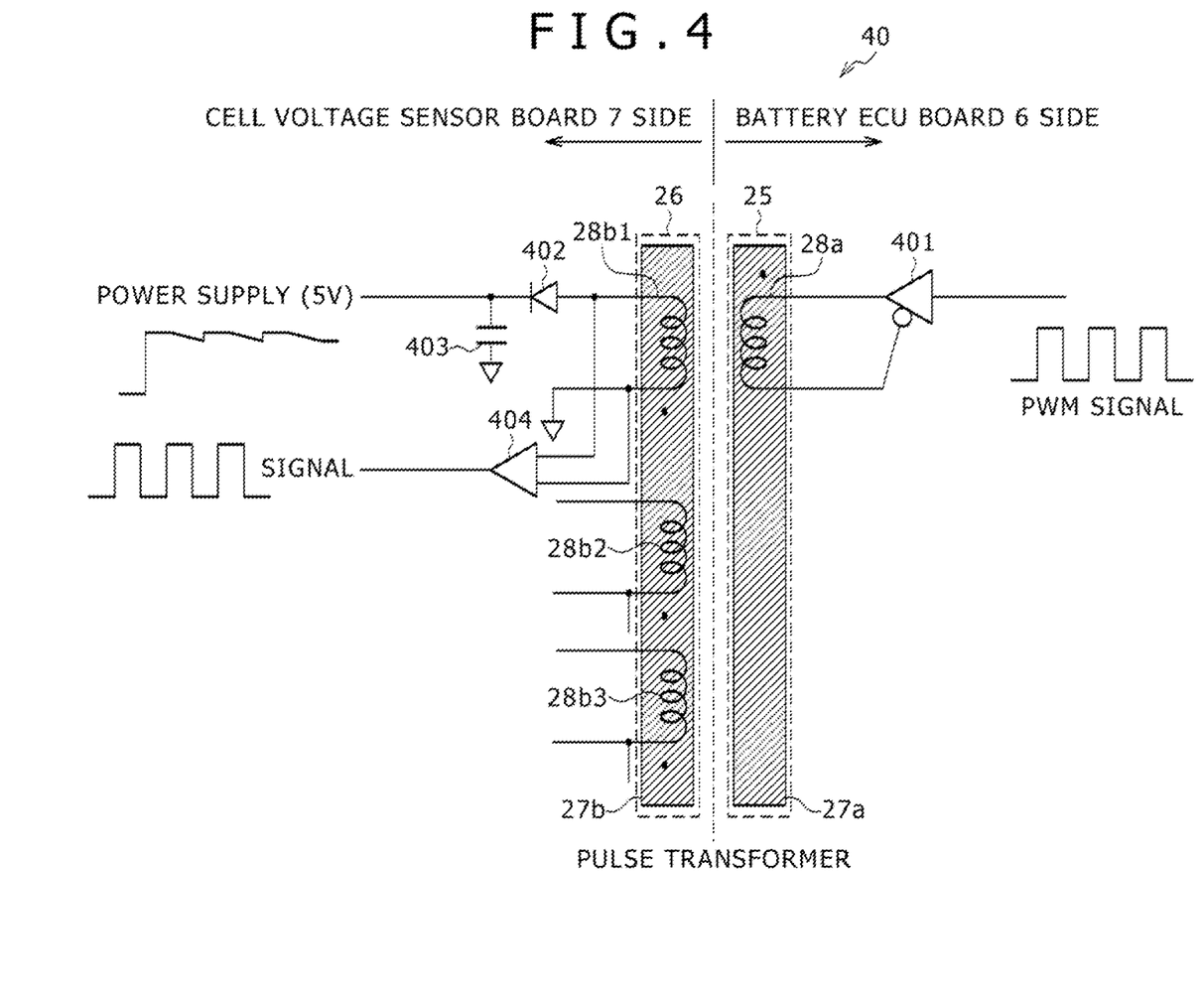
FIG. 4 is a diagram showing an example of a DC/DC converter according to the second embodiment of the present disclosure.

FIG. 4 is a diagram showing an example of the DC/DC converter 40 according to the second embodiment of the present disclosure.

As shown in FIG. 4, the DC/DC converter 40 according to the second embodiment includes a first communication element 25, a second communication element 26, a switching element 401, a diode 402, a capacitor 403, and a differential buffer 404.

The DC/DC converter 40 according to the second embodiment which DC/DC converter 40 is shown in FIG. 4 is a DC/DC converter of a configuration referred to as a flyback type.

The first communication element 25 includes a core 27a and a coil 28a. The second communication element 26 includes a core 27b and coils 28b1, 28b2, and 28b3. The coil 28a is a primary coil. The coils 28b1, 28b2, and 28b3 are secondary coils. The coil 28a and the coils 28b1, 28b2, and 28b3 are arranged so as to be opposite from each other in polarity, and form a pulse transformer.

Incidentally, FIG. 4 omits for convenience a rectifying diode, a smoothing capacitor, and a differential buffer that are connected to each of the coils 28b2 and 28b3 as in the case of the coil 28b1.

The operation of the DC/DC converter 40 according to the second embodiment corresponds to a case where the relation between the coil 28a and the coil 28b according to the first embodiment is applied to each of the pair of the coil 28a and the coil 28b1, the pair of the coil 28a and the coil 28b2, and the pair of the coil 28a and the coil 28b3. Therefore, description of the operation of the DC/DC converter 40 according to the second embodiment will be omitted.

The processing of the voltage detecting device 1 according to the second embodiment will next be described. The processing of the voltage detecting device 1 will be described in the following by taking as an example a case where the voltage detecting device 1 shown in FIG. 3 includes the DC/DC converter 40 shown in FIG. 4. Incidentally, suppose that the integrated circuits 30 and corresponding battery cell groups 10 are connected to each other such that the lowest potentials of the respective integrated circuits 30 coincide with the lowest potentials of the respective corresponding battery cell groups 10.

Description in the following will be made of a part of processing of the voltage detecting device 1 according to the second embodiment which part is different from that of the voltage detecting device 1 according to the first embodiment.

The processor 80 generates a PWM signal. The processor 80 outputs the generated PWM signal to the DC/DC converter 40.

The DC/DC converter 40 is a circuit of the flyback type shown in FIG. 4, for example. When the switching element 401 included in the DC/DC converter 40 is supplied with the PWM signal from the processor 80, the switching element 401 is set in an on state to send a current through the coil 28a included in the first communication element 25 during the period that the PWM signal is in a High state. At this time, it is difficult for the coil 28b1 included in the second communication element 26 to send a current because of the presence of the diode 402. Then, the core 27b is magnetized, and stores a magnetic energy.

The switching element 401 is set in an off state during the period that the PWM signal is in a Low state. Then, no current flows through the coil 28a. At this time, the magnetic energy stored by the core 27b causes a current to flow from the coil 28b1 through the diode 402. The capacitor 403 stores a charge on the basis of the current sent by the diode 402.

Processing similar to the above-described processing for the coil 28a and the coil 28b1 is also performed simultaneously for each of the pair of the coil 28a and the coil 28b2 and the pair of the coil 28a and the coil 28b3.

When the switching element 401 included in the DC/DC converter 40 is supplied with the PWM information signal, the switching element 401 switches between an on state and an off state according to the High period and the Low period indicated by the PWM information signal. A voltage corresponding to the on state and the off state of the switching element 401 is generated as voltage across the coil 28b1 included in the second communication element 26. The differential buffer 404 is connected to both ends of the coil 28b1. The differential buffer 404 outputs a signal including information indicating the timing of sampling of each cell voltage in the battery cell group 10, the information being based on the PWM information signal, to the corresponding A/D converting circuit 302.

Processing similar to the above-described processing for the coil 28a and the coil 28b1 is also performed simultaneously for each of the pair of the coil 28a and the coil 28b2 and the pair of the coil 28a and the coil 28b3.

A level converting section 301 provided to the cell voltage sensor board 7 is converting each cell voltage input from the battery cell group 10 into a voltage of a magnitude according to the full scale of the A/D converting circuit 302.

When the A/D converting circuit 302 is supplied with the signal including the information indicating the sampling timing from the differential buffer 404, the A/D converting circuit 302 obtains each cell voltage after the conversion by the level converting section 301 from the level converting section 301 in the sampling timing. The A/D converting circuit 302 converts each cell voltage (analog signal) obtained from the level converting section 301 into a digital signal. The A/D converting circuit 302 transmits and receives digital signals after conversion to and from adjacent integrated circuits 30.

For example, the integrated circuit 30a outputs the digital signal after the conversion by the A/D converting circuit 302a to the integrated circuit 30b. When the integrated circuit 30b is supplied with the digital signal after the conversion from the integrated circuit 30a, the integrated circuit 30b generates a new digital signal obtained by linking the digital signal after the conversion by the A/D converting circuit 302b to the input digital signal after the conversion by the A/D converting circuit 302a. The integrated circuit 30b outputs the newly generated digital signal to the integrated circuit 30c. When the integrated circuit 30c is supplied with the newly generated digital signal from the integrated circuit 30b, the integrated circuit 30c generates a new digital signal obtained by further linking the digital signal after the conversion by the A/D converting circuit 302c to the input digital signal. This linking processing is repeated for all of the integrated circuits 30. Then, the last integrated circuit 30 (integrated circuit 30c in FIG. 3) outputs, to the insulating element 50, a digital signal obtained by linking together the digital signals after the conversion by the A/D converting circuits 302 included in all of the integrated circuits 30.

The insulating element 50 generates a signal on the basis of the digital signal input from the integrated circuit 30c. When the digital signal is represented by a voltage, and the insulating element 50 is a photocoupler, for example, the photocoupler is supplied with an input current corresponding to the digital signal using a resistance. The photocoupler generates light corresponding to the input current, and emits the light from the cell voltage sensor board 7 to the battery ECU board 6 within the photocoupler. The photocoupler converts the generated light into a corresponding current on the battery ECU board 6.

The insulating element 50 outputs the current corresponding to the light to the processor 80. The processor 80 is supplied with a signal corresponding to the current output by the insulating element 50. For example, the processor 80 converts the current corresponding to the digital signal into a voltage by a resistance, and is supplied with a digital signal indicated by the voltage. This digital signal is generated on the basis of the digital signals output by all of the A/D converting circuits 302, and includes the information on each cell voltage obtained from all of the level converting sections 301.

The processor 80 performs control so as to prevent the battery cell group 10 from being overcharged, by outputting command signals to various circuits (not shown) managed by the processor 80 on the basis of the input digital signal.

The processing of the voltage detecting device 1 according to the second embodiment of the present disclosure has been described above. According to the above-described voltage detecting device 1, the DC/DC converter 40 included in the voltage detecting device 1 includes the second communication element 26 having the plurality of coils.

Thus, it suffices to include only one coil 28a in the first communication element 25 in the voltage detecting device 1, so that the DC/DC converter 40 can be miniaturized.

In addition, new digital signals obtained by linking together digital signals after the conversion by A/D converting circuits 302 are transmitted and received between the integrated circuits 30.

Thus, the digital signals after the conversion by all of the A/D converting circuits 302 can be transmitted to the processor 80 by one insulating element 50 in the voltage detecting device 1, so that the voltage detecting device 1 can be miniaturized.

Incidentally, a storage section in the present disclosure may be disposed anywhere insofar as appropriate information transmission and reception are performed. In addition, there may be a plurality of storage sections storing data in a distributed manner insofar as appropriate information transmission and reception are performed.

Incidentally, the order of the processing in the embodiments of the present disclosure may be changed insofar as appropriate processing is performed.

Embodiments of the present disclosure have been described above. The voltage detecting device 1 described above internally has a computer system. The processes of the above-described processing are stored on a computer readable recording medium in the form of a program. The above-described processing is performed by a computer by reading out and executing the program. The computer readable recording medium refers to a magnetic disk, a magneto-optical disk, a CD-read only memory (ROM), a DVD-ROM, a semiconductor memory, and the like. In addition, the computer program may be distributed to a computer by a communication line, and the computer that has received the distribution may execute the program.

In addition, the program may be a program for implementing a part of the foregoing functions. Further, the program may be a program that enables the foregoing functions to be implemented in combination with a program already recorded in a computer system, that is, a so-called differential file (differential program).

Some embodiments of the present disclosure have been described. However, these embodiments are presented as examples, and do not limit the scope of the disclosure. In addition, these embodiments are susceptible of various omissions, replacements, and changes without departing from the spirit of the disclosure.

I claim:
1. A voltage detecting device comprising:
an analog converting circuit configured to level-convert voltages of a battery comprising plurality of battery cells into low voltages;
a digital converting circuit configured to convert the low voltages output by the analog converting circuit into digital values; and
a control circuit configured to be driven by a power supply provided separately to control the digital converting circuit;

wherein the analog converting circuit is driven by a first power generated from the plurality of battery cells, and wherein the digital converting circuit is driven by a second power generated on a basis of a pulse signal generated by the control circuit.

2. The voltage detecting device according to claim 1, further comprising a smoothing circuit configured to generate the second power by smoothing the pulse signal generated by the control circuit.

3. The voltage detecting device according to claim 2, wherein the pulse signal is a modulated signal including control information for the digital converting circuit.

4. The voltage detecting device according to claim 3, wherein the modulated signal is a pulse width modulation signal indicating the control information as a duty ratio.

5. The voltage detecting device according to claim 2, wherein the pulse signal is supplied from the control circuit to the smoothing circuit via a pulse transformer.

* * * * *